United States Patent [19]
Broeke et al.

[11] Patent Number: 6,139,994
[45] Date of Patent: Oct. 31, 2000

[54] USE OF INTERSECTING SUBRESOLUTION FEATURES FOR MICROLITHOGRAPHY

[76] Inventors: Doug Van Den Broeke, 917 Mockingbird La., Sunnyvale, Calif. 94087; Fung Chen, 11752 Pine Brook La., Cupertino, Calif. 95014

[21] Appl. No.: 09/344,251

[22] Filed: Jun. 25, 1999

[51] Int. Cl.⁷ ................................................ G03F 9/00
[52] U.S. Cl. .................................................... 430/5
[58] Field of Search ................ 430/5, 322; 700/57, 700/74

[56] References Cited

U.S. PATENT DOCUMENTS

| | | |
|---|---|---|
| 5,194,346 | 3/1993 | Roltson et al. . |
| 5,208,124 | 5/1993 | Sporon-Fiedler et al. . |
| 5,208,125 | 5/1993 | Lowery et al. . |
| 5,268,244 | 12/1993 | Yoo . |
| 5,328,807 | 7/1994 | Tanaka et al. ............... 430/5 |
| 5,362,584 | 11/1994 | Brock et al. . |
| 5,418,095 | 5/1995 | Vasuden et al. . |
| 5,565,286 | 10/1996 | Lin . |
| 5,624,773 | 4/1997 | Pforr et al. . |
| 5,698,349 | 12/1997 | Yang . |

*Primary Examiner*—S. Rosasco
*Attorney, Agent, or Firm*—Amster, Rothstein & Ebenstein

[57] ABSTRACT

A method for creating an image on an image plane utilizing a photomask comprised of a plurality of intersecting subresolution features. Energy created by an energy source is projected through the subresolution features which diffract the light to produce constructive or positive interference thereby resulting in an image being formed on the image plane that is different than the image or pattern of subresolution features on the photomask.

33 Claims, 5 Drawing Sheets

USE OF INTERSECTING SUBRESOLUTION FEATURES FOR MICROLITHOGRAPHY

BACKGROUND

The present invention relates to the use of intersecting subresolution features in the creation of an image on an image plane, and more specifically to the use of intersecting subresolution features (and the light transfer properties associated therewith) on photomasks used to create microscale images defining a semiconductor circuit onto a silicon or gallium arsenide substrate or wafer.

The process for transferring an image from a photomask to a silicon substrate or wafer is commonly referred to as lithography or microlithography. A photomask is comprised of a substrate (e.g., quartz) and an attenuator (e.g., chromium), with the pattern of the attenuator material being representative of the image desired to be formed on the image plane (e.g., a layer of photoresist material on a silicon wafer). The photomask is placed between an optical system and an energy source. The energy from the energy source is inhibited from passing through the areas of the photomask in which the attenuator material is present. The optical system projects a scaled image of the pattern of the attenuator material onto the image plane. The solubility of the photoresist material is changed in areas exposed to the energy. In the case of a positive photolithographic process, the exposed photoresist becomes soluble and can be removed. In the case of a negative photolithographic process, the exposed photoresist becomes insoluble and unexposed soluble photoresist is removed.

After the soluble material is removed, the resist image is transferred to the substrate by a process well known in the art which is commonly referred to as etching. Once the pattern is etched onto the substrate material, the remaining resist is removed resulting in a finished product.

However, as the resolution limits of the optical systems are approached, the actual transferred image becomes less and less a reduced representation of the photomask attenuator pattern. Several approaches to correct this optical distortion have been proposed and are collectively referred to as optical proximity correction or OPC. Optical proximity correction techniques modify the pattern of attenuator material on the photomask in such a way as to achieve the desired image at the image plane. Examples of well known optical correction techniques include serifs (described in U.S. Pat. No. 5,663,893 to Wampler) edge biasing, and edge jogs.

One embodiment of U.S. Pat. No. 5,362,584 to Brock et al. illustrated in FIG. 5 therein, is directed to the use of a plurality of phase-shifting regions 12e arranged in a grid-like arrangement. Phase-shifting regions 12e have circumferential edges spaced apart by a minimum distance d, with the resulting image formed on substrate 15e being a substantially rectangular image 16e. Similar embodiments are shown in FIGS. 6 and 7.

U.S. Pat. No. 5,698,349 to Yang et al. is directed to the fabrication of a phase shift mask comprised of a quartz substrate, a layer of chromium, a layer of phase shift material (e.g., silicon dioxide), and opaque spacers of sputtered chromium. The phase shift material overhangs the edges of the chromium by 500–5000 Angstroms. Light passing through the photomask is focused on the surface of a silicon wafer, with the alleged invention providing improved image resolution. However, there is no disclosure in the Yang Patent directed to the use of intersecting subresolution features to form desired images on an image plane.

In short, nowhere in the prior art known to the applicants have intersecting subresolution features and the light transfer properties associated therewith been used to create images on an image plane.

SUMMARY OF INVENTION

Accordingly, it is the object of the present invention to create images on an image plane using intersecting subresolution features formed in the attenuator material of a microlithographic mask.

It is a further object of the present invention to create images in a layer of photosenstive material from a microlithographic mask comprising a plurality of intersecting subresolution features in which the image created in the layer of photosensitive material has an improved resolution and depth of focus.

DETAILED DESCRIPTION OF THE PREFERRED EMBODIMENT

When light is projected through a single subresolution feature on a photomask, it experiences a natural phenomena known as diffraction. Diffraction is the redistribution in space of the intensity of waves that results from the presence of an object that causes variations of either the amplitude or phase of the light waves. Simply put, a subresolution feature causes the light passing through it to bend or be diffused in such a manner that no discernable pattern of light is formed on the image plane. As used throughout this specification, the term "subresolution feature" is defined as a structure on a photomask that when projected through a given optical system, will not result in a printable image on the image plane. It will be understood by those skilled in the art that the physical dimensions of a subresolution feature will vary based on the wave length of the light or energy source.

However, when individual subresolution features on a photomask are arranged such that they intersect with one another, the light diffracted by each individual subresolution feature interacts with the light diffracted by the other individual subresolution features. This constructive or positive interference between the intersecting subresolution features results in an accumulation of light at the image plane sufficient to form a discernable pattern, albeit a pattern different from the pattern formed by the intersecting subresolution features.

Figure 1A:
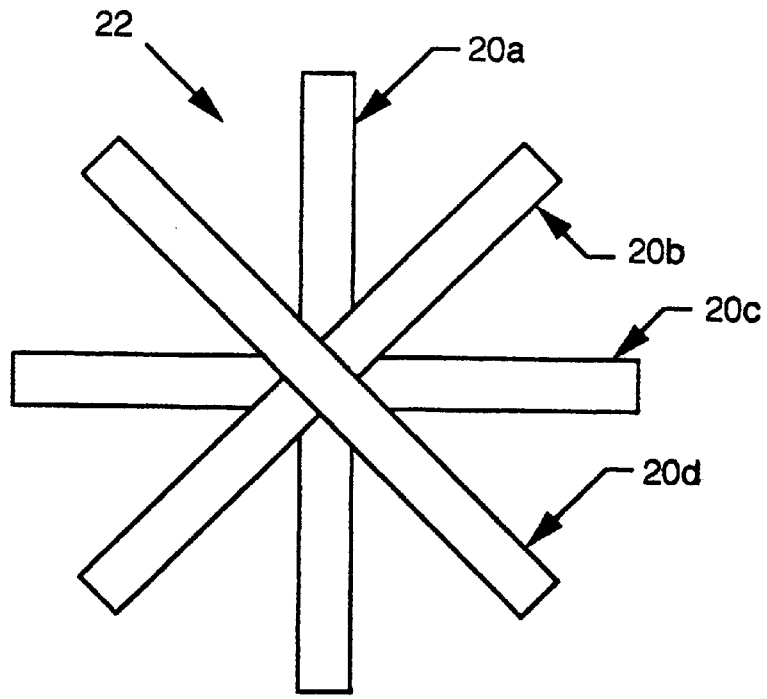
FIGS. 1A–1C illustrates a first embodiment of intersecting subresolution features used to create a circular pattern on an image plane.
Figure 1B:
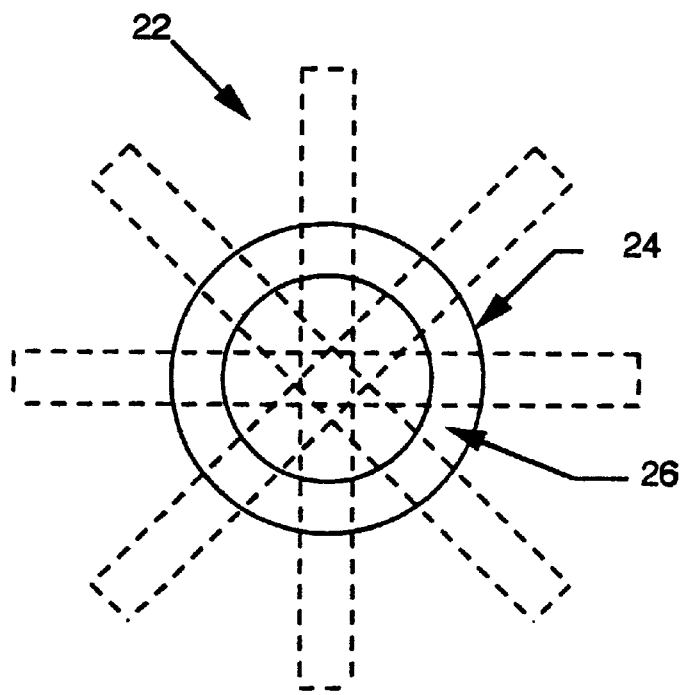
Figure 1C:
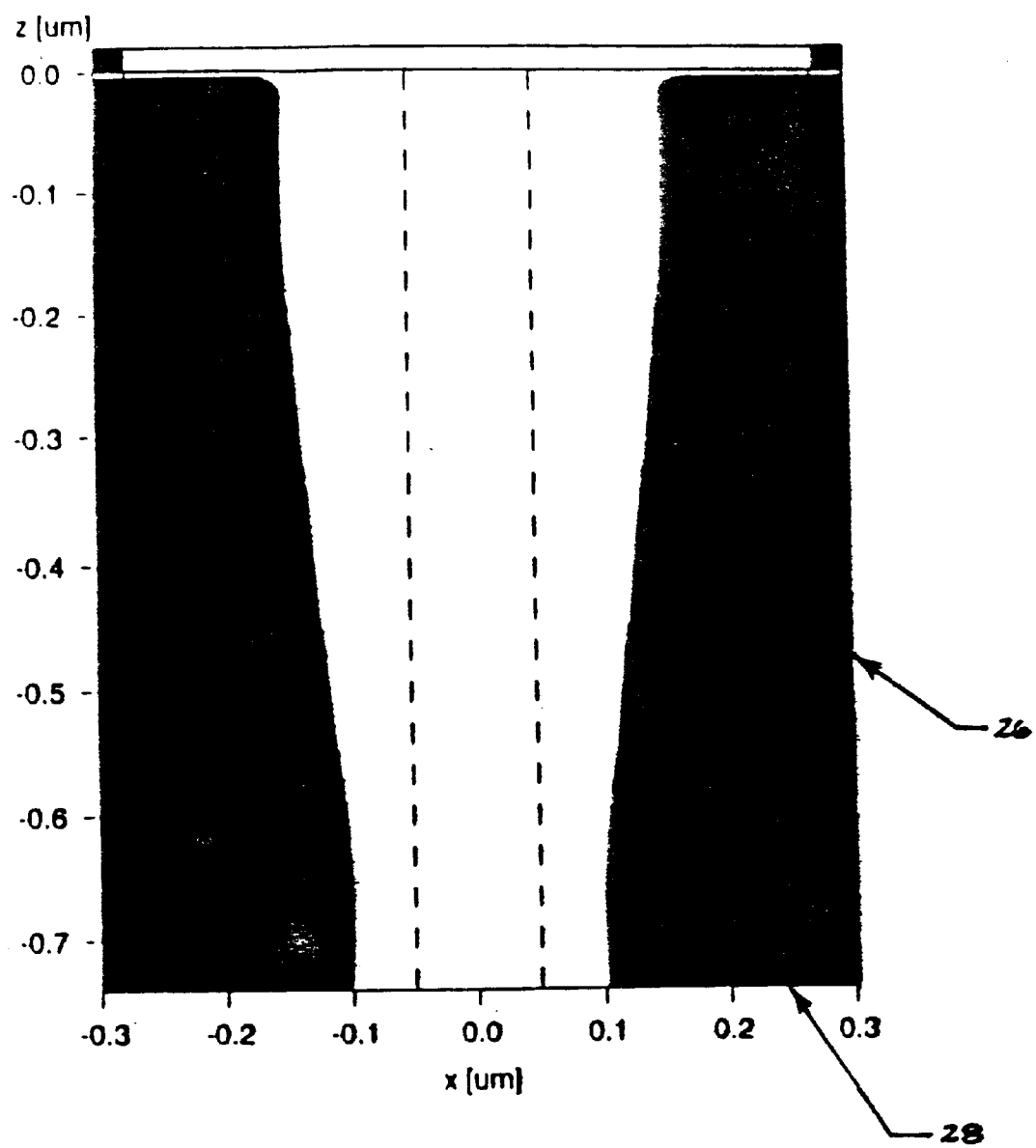

One embodiment of the invention is shown in FIGS. 1A–1C. As shown in FIG. 1A, the pattern of subresolution features formed in the attenuator material on a photomask is comprised of four individual subresolution features 20a–20d. In this embodiment the individual rectangular subresolution features are approximately identical in shape, with each of the four rectangularly shaped subresolution features 20*a*–20*d* being approximately 3.0 μm in length and approximately 0.35 μm in width on the reticle or 5× mask. Subresolution features 20*a*–20*d* are arranged such that they intersect with one another at their longitudinal midpoints and are angularly separated from one another by approximately forty five (45) degrees, thereby forming an asterisk shaped pattern 22.

FIG. 1B depicts the resulting image 24 formed at the image plane when energy having a 365 nm wavelength is projected through the asterisk shaped pattern 22. As shown, the resulting image 24 superimposed over the dash-lined subresolution feature pattern 22 is substantially circular in shape with a diameter of approximately 0.301 μm. The circular image 26 represents the diameter of the image formed, for example, at the surface of the photoresist material adjacent to the substrate material. As described above, the resulting circular image 24 created on the image plane is formed by the accumulation of light diffracted from each of the individual subresolution features 20*a*–20*d*.

The depth of focus of the circular image 24 created by the asterisk pattern 22 of subresolution features 20*a*–20*d* is illustrated in the cross-sectional view of photosensitive resist material 26 shown in FIG. 1C. The diameter of the circular image 24 at the surface of the photosensitive material 26 in which the energy comprising circular image 24 first encounters (i.e., the image plane) is approximately 0.301 μm in diameter. As shown, the circular dimension of the exposed photosensitive material is gradually tapered with the dimension of the circular image 24 at the surface of the photosensitive material 28 adjacent to substrate being approximately 0.204 μm in diameter.

A circular image can also be created using the pattern of intersecting subresolution features shown in FIG. 1A, using an energy source operating in a different frequency spectrum. However, as mentioned above, the dimensions of the subresolution features would have to be modified accordingly. For example, if the an energy source operating in the ultraviolet (UV) frequency spectrum were used, the dimensions of the subresolution features 20A–20*d* of FIG. 1A would be approximately 2.4 μm in length and 0.28 μm in width at the reticle or 4× mask, and the diameter of the circular image at the surface of the photosensitive material (i.e., the image plane) being approximately 0.22 μm.

Figure 2A:
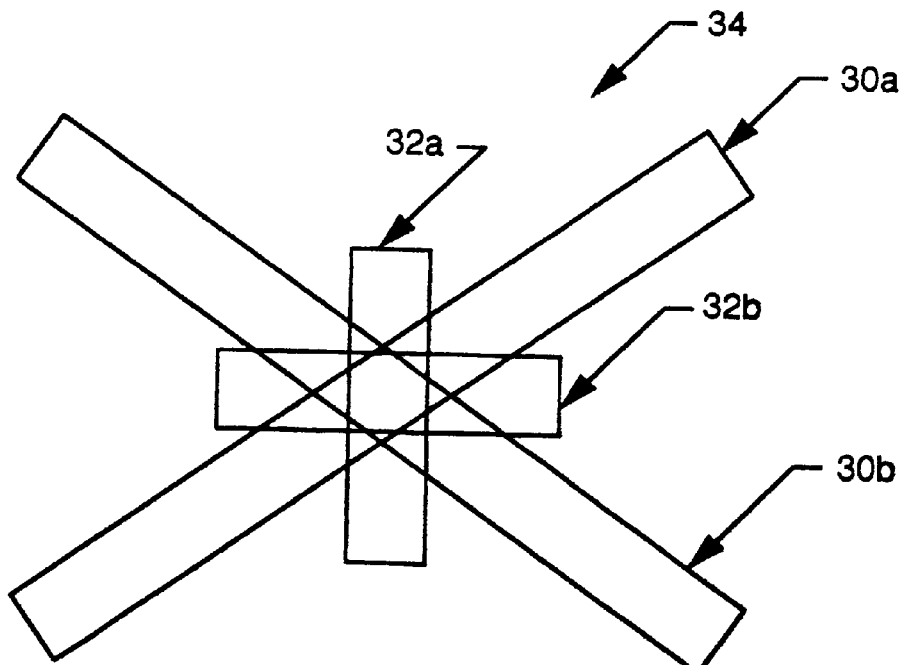
FIGS. 2A–2B illustrate a second embodiment of intersecting subresolution features used to create a substantially oval or elliptical pattern on an image plane.
Figure 2B:
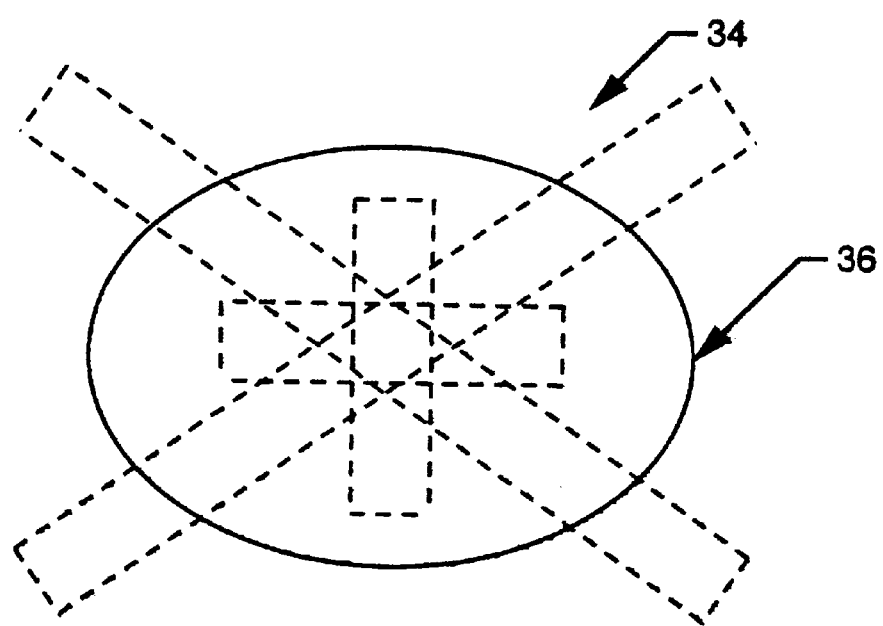

FIGS. 2A–2B illustrate a second embodiment of the instant invention. As shown in FIG. 2A, the pattern of subresolution features formed in the attenuator material on a photomask is comprised of four individual rectangularly shaped subresolution features. Two of the four rectangularly shaped subresolution features 30*a*–30*b* are approximately twice the length of the other two of the rectangularly shaped subresolution features 32*a*–32*b*. Both subresolution features 30*a*–30*b* and 32*a*–32*b* are approximately the same width. As previously indicated, the actual dimensions of the subresolution features depend on the wavelength of the energy source used.

Subresolution features 30*a*–30*b* and 32*a*–32*b* are arranged such that they intersect with one another at their respective longitudinal midpoints. Subresolution features 32*a*–32*b* are arranged such that they are approximately perpendicular to one another. However, subresolution features 30*a*–30*b* are arranged such that the vertical angles formed by their intersection are greater than 90 degrees, and, accordingly, the horizontal angles formed by their intersection are less than 90 degrees.

FIG. 2B depicts the resulting image 36 formed on the image plane when energy is projected through the pattern of subresolution shaped features shown in FIG. 2A. The resulting image 36, shown superimposed over the dash-lined subresolution feature pattern 34, is substantially elliptical or oval in shape with the elongated dimension of the oval being in the horizontal direction. As set forth above, the actual dimensions of the created elliptical or oval shape is a function of the dimensions of the subresolution features and wavelength of the energy source. It will be appreciated by those skilled in the art that the orientation of the resulting oval pattern can be changed by changing the angular orientation of subresolution features 30*a*–30*b*. Thus, if subresolution features 30*a*–30*b* were arranged such that the vertical angles formed by their intersection are less than 90 degrees, and the horizontal angles formed by their intersection are greater than 90 degrees, the elongated dimension of the resulting oval or elliptical pattern would be in the vertical direction.

Figure 3A:
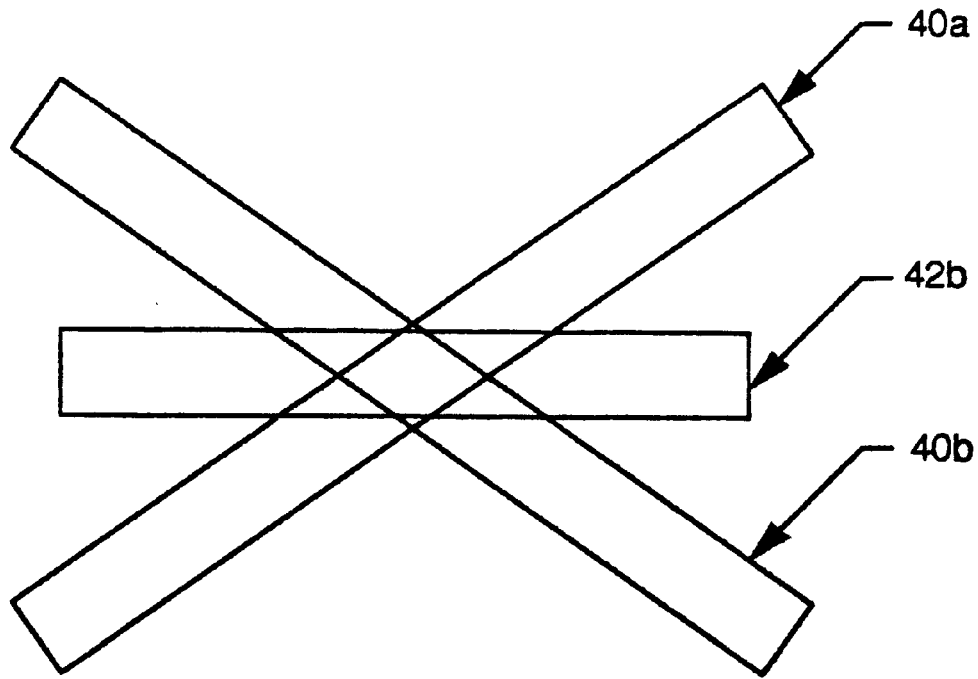
FIGS. 3A–3B illustrate a third embodiment of intersecting subresolution features used to create an elliptical pattern on an image plane.
Figure 3B:
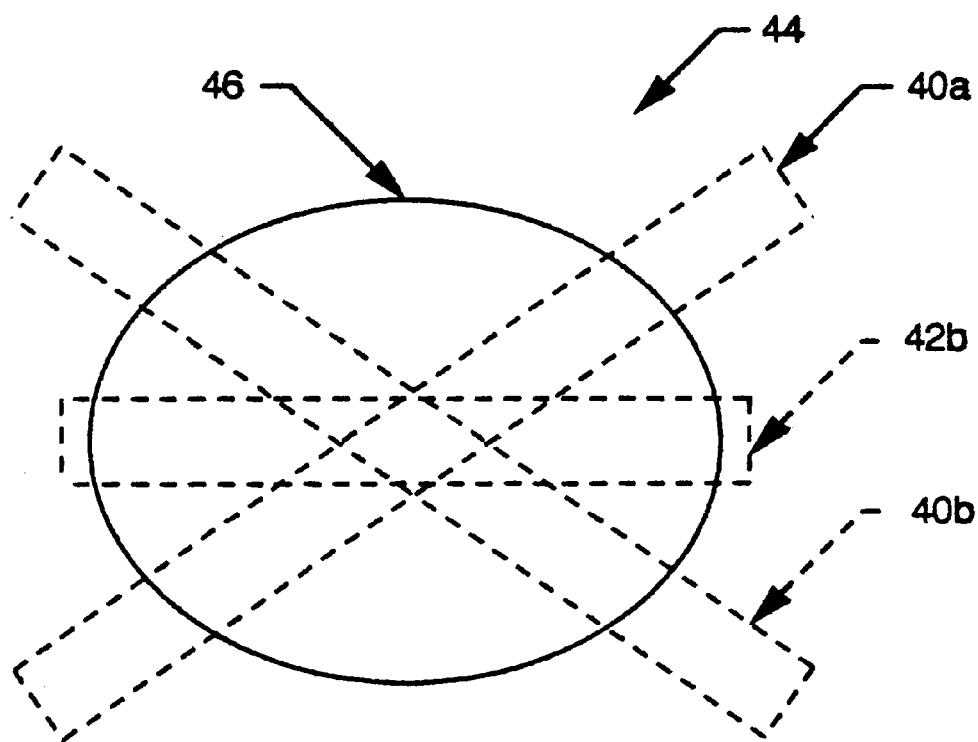

FIGS. 3A–3B depict a third embodiment of the instant invention. As shown in FIG. 3A, the pattern 44 of subresolution features formed in the attenuator material on a photomask is comprised of three individual rectangularly shaped subresolution features 40*a*–40*c*, having approximately the same physical dimensions. The actual dimensions of the subresolution features depends on the wavelength of the energy or light source used.

Subresolution features 40*a*–40*c* are arranged such that they intersect with one another at their respective longitudinal midpoints. Subresolution features 40*a* and 40*b* are arranged such that the vertical angles formed by their intersection are greater than 90 degrees, and the horizontal angles formed by their intersection are less than 90 degrees. Subresolution feature 40*c* is arranged such that it substantially bisects the horizontal angles formed by the intersection of subresolution features 40*a* and 40*b*.

FIG. 3B depicts the resulting image 46 formed on the image plane when energy is projected through the pattern shown in FIG. 3A. As shown, the resulting image 46, superimposed over the dash-lined subresolution feature pattern 44, is substantially elliptical or oval in shape with the elongated dimension of the oval being in the horizontal direction. It will be appreciated by those skilled in the art that the orientation of the resulting oval pattern can be changed by changing the orientation of subresolution features 40*a*–40*c*. Thus, if subresolution features 40*a*–40*b* were arranged such that the vertical angles formed by their intersection are less than 90 degrees, and the horizontal angles formed by their intersection are greater than 90 degrees, and subresolution feature 40*c* was arranged such that it bisected the aforementioned vertical angles, the elongated dimension of the resulting oval pattern would be in the vertical direction.

Figure 4A:
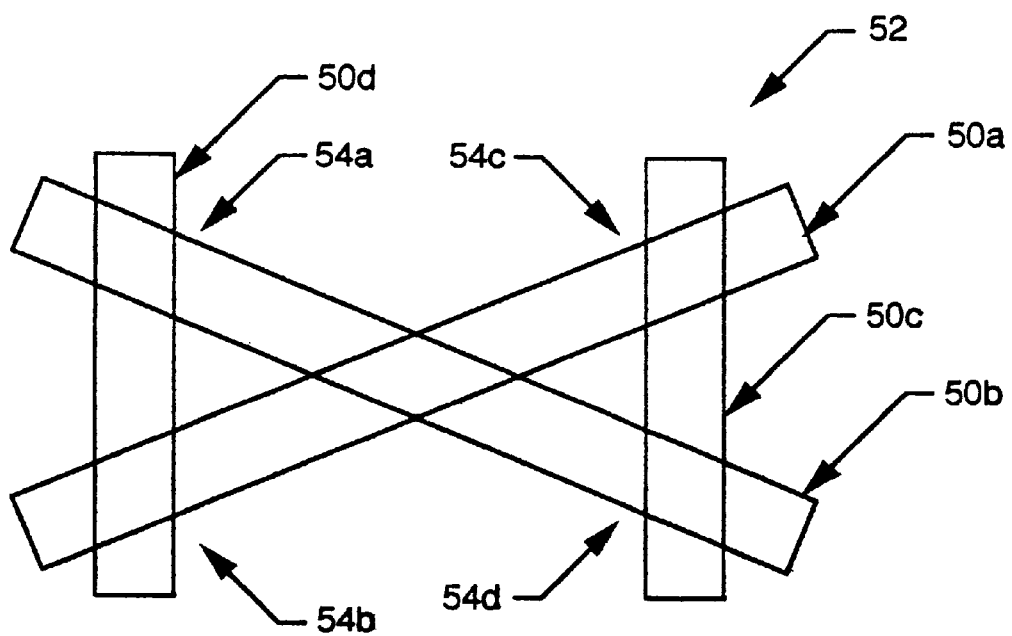
FIGS. 4A–4B illustrate a fourth embodiment of intersecting subresolution features used to create an elliptical pattern on an image plane.
Figure 4B:
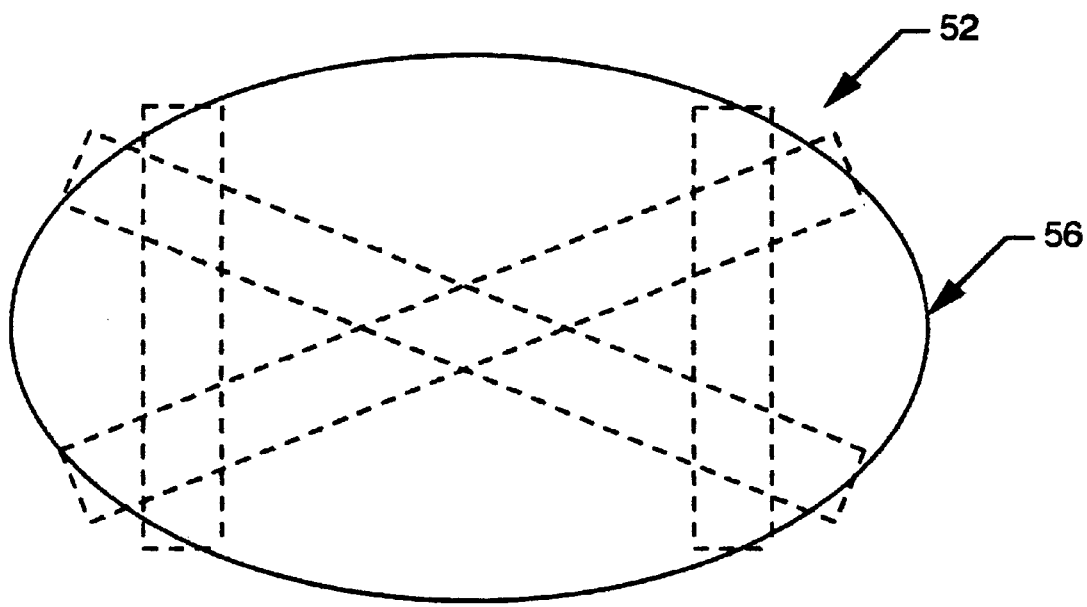

FIG. 4A–4B depict the preferred embodiment for forming an oval or elliptical shaped pattern on the image plane. As shown in FIG. 4A, the pattern 52 of subresolution features formed in the attenuator material of the photomask is comprised of four individual rectangular subresolution features 50*a*–50*d*. In this embodiment, subresolution features 50*a* and 50*b* are substantially of the same dimension and shape. For illustrative purposes, in the case where a 365 nm wavelength energy source is used, the length of subresolution features 50*a* and 50*b* may be approximately 4.0 μm in length and approximately 0.35 μm in width. Likewise, subresolution features 50*c* and 50*d* are also of substantially the same dimension and shape, and, in the case where a 365 nm wavelength energy source is used, the length of subresolution features 50*c* and 50*d* may be approximately 1.2 μm in length and approximately 0.35 μm in width. However, it will be appreciated that the actual dimensions of subresolution features 50a–50d may vary depending on the wavelength of the light being used.

Subresolution features 50a and 50b are arranged such that they intersect at the respective longitudinal midpoints and are arranged such that the vertical angles formed by their intersection are approximately 135 degrees, and accordingly, the horizontal angles formed by their intersection are approximately 45 degrees. Subresolution features 50c and 50d are oriented vertically and arranged such that they do not intersect each other but do intersect subresolution features 50a and 50b. More specifically, vertically oriented subresolution feature 50d is arranged such that it intersects the left portions of subresolution features 50a and 50b at intersecting points 54a and 54b, and vertically oriented subresolution feature 50c is oriented such that it intersects the right portions of subresolution features 50a and 50b at intersecting points 54c and 54d.

FIG. 4B depicts the resulting image 56 formed on the image plane when energy is projected through the pattern 52 shown in FIG. 4A. As shown, the resulting image 56 superimposed over the dash-lined subresolution feature pattern 54, is substantially elliptical or oval in shape with the elongated dimension of the oval being in the horizontal direction. In the case where the subresolution features are of the illustrative dimensions defined above, the dimension of the resulting oval pattern in the horizontal and vertical axes are approximately 0.4 $\mu$m and 0.2 $\mu$m respectively.

As with the other embodiments, it will be appreciated by those skilled in the art that the orientation of the resulting oval pattern can be changed by changing the orientation of subresolution features 50a–50d. Thus, if subresolution features 50a–50b were arranged such that the vertical angles formed by their intersection were approximately 45 degrees, and the horizontal angles formed by their intersection were approximately 135 degrees, and subresolutions feature 50c and 50d were horizontally oriented and positioned to intersect the upper and lower portions of subresolution features 50a and 50b, the elongated dimension of the resulting oval pattern would be in the vertical direction.

It will be appreciated that the subresolution features depicted in FIGS. 1–4 herein are for illustrative purposes and are therefore not necessarily to scale.

Various additional modifications and improvements thereon will become readily apparent to those skilled in the art. The desired image formed on the image plane can be achieved by varying the number of subresolution features, the length and widths of the subresolution features, and the manner in which the subresolution features intersect, it is only necessary to maintain the structure size below the resolution of the imaging system that will be utilized. Additionally, those skilled in the art will appreciated that a number of patterns of subresolution features may be combined to form a variety of images on an image plane.

Additionally, the instant invention is applicable for use with various types of imaging energy including, but not limited to, light (i.e., visible, UV, DUV, and EUV), x-ray, electron beam, and ion beam. Further, the instant invention can be utilized with existing attenuated phase shift mask, hard shifting phase mask, and trim mask technologies.

Furthermore, the subresolution features need not be rectangular in shape and may be parallelograms, trapezoids, or any other geometric shape.

Accordingly, the spirit and scope of the present invention is to be construed broadly and limited only by the appended claims, and not by the foregoing specification.

What is claimed is:

1. A photomask comprised of an attenuator and a substrate for producing an image on an image plane, said attenuator having a pattern formed therein through which energy may pass, said pattern in said attenuator comprised of a plurality of intersecting subresolution features, wherein said energy passing through said intersecting subresolution features and said substrate creates an image on said image plane that is a different shape than the shape of said pattern in said attenuator.

2. The photomask of claim 1, wherein said plurality of said subresolution features are rectangular in shape.

3. The photomask of claim 2, wherein said plurality of intersecting subresolution features intersect at each of their longitudinal midpoints.

4. The photomask of claim 3, wherein said plurality of said intersecting subresolution features are angularly positioned such that the angles formed between each of said subresolution features are approximately equal.

5. The photomask of claim 4, wherein each of said rectangularly shaped subresolution features is substantially identical, and said image created on said image plane is substantially circular.

6. The photomask of claim 3, wherein said plurality intersecting subresolution features is comprised of two short rectangular subresolution features and two long rectangular subresolution features, wherein said long rectangular subresolution features are approximately twice as long as said short rectangular subresolution features.

7. The photomask of claim 6, wherein said two short rectangular subresolution features are angularly positioned approximately perpendicular to one another, and said two long rectangular subresolution features angular positioned such that they intersect at an angle other than approximately 90 degrees, and said image created at said image plane is substantially elliptical in shape.

8. The photomask of claim 3, wherein said plurality intersecting subresolution features is comprised of three substantially identical rectangularly shaped subresolution features.

9. The photomask of claim 8, wherein said plurality of rectangular subresolution features intersect at angles other than approximately 90 degrees, and said image created at said image plane is substantially elliptical in shape.

10. The photomask of claim 1 wherein said image plane is a layer of photosensitive material and said image created at said image plane is created in said photosensitive material.

11. The photomask of claim 1 wherein said layer of photosensitive material resides on a semiconductor wafer and said image create at said image plane is also created in said semiconductor wafer.

12. The photomask of claim 1 wherein said photomask is an attenuated phase shift mask.

13. The photomask of claim 1 wherein said photomask is a binary mask.

14. The photomask of claim 13, wherein said subresolution features are rectangularly shaped.

15. The photomask of claim 14, wherein said plurality of said subresolution features is comprised of a first subresolution feature intersecting a second subresolution feature at their longitudinal midpoints, a third subresolution feature intersecting said first and said second subresolution features other than at said longitudinal midpoints, and a fourth subresolution feature intersecting said first and said second subresolution features other than at said longitudinal midpoints, said third and fourth subresolution features not intersecting with each other, wherein the image formed at said image plane is substantially elliptical in shape.

16. The photomask of claim 13 wherein said image plane is a layer of photosensitive material and said image created at said image plane is created in said photosensitive material.

17. The photomask of claim 13 wherein said layer of photosensitive material resides on a semiconductor wafer and said image create at said image plane is also created in said semiconductor wafer.

18. The photomask of claim 13 wherein said photomask is an attenuated phase shift mask.

19. The method of claim 18 wherein said pattern of said intersecting subresolution features is comprises of four approximately identically shaped rectangular features, said rectangular features intersecting at approximately each of their longitudinal midpoints and angularly positioned at approximately forty-five degree angles to one another, wherein said image formed at said image plane is approximately circular.

20. The method of claim 18, wherein said subresolution features intersect at a plurality of points.

21. The photomask of claim 13 wherein said photomask is a binary mask.

22. The photomask of claim 1, wherein said plurality of patterns are comprised of subresolution features which are rectangular in shape.

23. A photomask comprised of an attenuator and a substrate, said attenuator residing on said substrate and inhibiting the transmission energy through said mask to an image plane, said attenuator having an aperture formed therein through which energy may be transmitted, said aperture comprised of a plurality of subresolution features, said subresolution features intersecting at a plurality of points, wherein the energy passing through said aperture creates an image on said image plane that is different in shape than the shape of said aperture.

24. The photomask of claim 14, wherein at least one subresolution feature does not intersect with at least one other subresolution feature.

25. A method for creating an image on an image plane from a photomask comprised of a substrate and attenuator material comprising the steps of:

forming in said attenuator material a pattern comprised of a plurality of intersecting subresolution features through which energy may pass, placing said photomask between an energy source and said image plane, and energizing said energy source, wherein said energy from said energy source passing through said pattern of subresolution features forms an image on said image plane that is different in shape than the shape of said pattern of subresolution features formed in said attenuator material.

26. The method of claim 22, wherein said plurality of said subresolution features is comprised of a first subresolution feature intersecting a second subresolution feature at their longitudinal midpoints, a third subresolution feature intersecting said first and said second subresolution features other than at said longitudinal midpoints, and a fourth subresolution feature intersecting said first and said second subresolution features other than at said longitudinal midpoints, said third and fourth subresolution features not intersecting with each other, wherein the image formed at said image plane is substantially elliptical in shape.

27. A photomask comprised of an attenuator and a substrate for producing an image on an image plane, said attenuator having a plurality of patterns formed therein through which energy may pass, said patterns in said attenuator comprised of a plurality of intersecting subresolution features, wherein said energy passing through said intersecting subresolution features and said substrate creates an image on said image plane that is a different shape than the shape of said patterns in said attenuator.

28. The photomask of claim 26, wherein said plurality of patterns intersect with one another.

29. The photomask of claim 26, wherein said plurality of patterns are substantially the same.

30. The photomask of claim 26 wherein said image plane is a layer of photosensitive material and said image created at said image plane is created in said photosensitive material.

31. The photomask of claim 26 wherein said layer of photosensitive material resides on a semiconductor wafer and said image created at said image plane is also created in said semiconductor wafer.

32. The photomask of claim 26 wherein said photomask is an attenuated phase shift mask.

33. The photomask of claim 26 wherein said photomask is a binary mask.

* * * * *